US011587822B2

(12) United States Patent
Gifford et al.

(10) Patent No.: US 11,587,822 B2
(45) Date of Patent: *Feb. 21, 2023

(54) STRUCTURES FOR IMPROVING RADIATION HARDNESS AND ELIMINATING LATCH-UP IN INTEGRATED CIRCUITS

(71) Applicant: Silicon Space Technology Corporation, Austin, TX (US)

(72) Inventors: David R. Gifford, Pflugerville, TX (US); Patrice M. Parris, Phoenix, AZ (US)

(73) Assignee: Silicon Space Technology Corporation, Austin, TX (US)

( * ) Notice: Subject to any disclaimer, the term of this patent is extended or adjusted under 35 U.S.C. 154(b) by 199 days.

This patent is subject to a terminal disclaimer.

(21) Appl. No.: 17/082,621

(22) Filed: Oct. 28, 2020

(65) Prior Publication Data

US 2021/0043496 A1 Feb. 11, 2021

Related U.S. Application Data

(63) Continuation of application No. 16/183,909, filed on Nov. 8, 2018, now Pat. No. 10,825,715.

(51) Int. Cl.
*H01L 21/74* (2006.01)
*H01L 29/10* (2006.01)
(Continued)

(52) U.S. Cl.
CPC .......... *H01L 21/743* (2013.01); *H01L 21/266* (2013.01); *H01L 21/26513* (2013.01);
(Continued)

(58) Field of Classification Search
CPC combination set(s) only.
See application file for complete search history.

(56) References Cited

U.S. PATENT DOCUMENTS

| 6,297,460 B1 | 10/2001 | Schaper |
| 6,927,460 B1 | 8/2005 | Leibiger |

(Continued)

FOREIGN PATENT DOCUMENTS

| EP | 0434182 B1 | 3/2002 |
| JP | 0216272 | 6/1990 |
| JP | 2162720 | 6/1990 |

OTHER PUBLICATIONS

"International Search Report in PCT Application No. PCT/US19/59753", dated Feb. 27, 2020, 4 Pages.

(Continued)

*Primary Examiner* — Nduka E Ojeh
(74) *Attorney, Agent, or Firm* — Ranjeev Singh; Singh Law, PLLC

(57) ABSTRACT

Structures and processes for improving radiation hardness and eliminating latch-up in integrated circuits are provided. An example process includes forming a first doped buried layer, a first well, and a second well, and using a first mask, forming a second doped buried layer only in a first region above the first doped buried layer and between at least the first well and the second well, where the first mask is configured to control spacing between the wells and the doped buried layers. The process further includes using a second mask, forming a vertical conductor located only in a second region above the first region and between at least the first well and the second well, where the vertical conductor is doped to provide a low resistance link between the second doped buried layer and at least a top surface of the substrate.

20 Claims, 9 Drawing Sheets

(51) Int. Cl.
  *H01L 27/092* (2006.01)
  *H01L 21/265* (2006.01)
  *H01L 21/762* (2006.01)
  *H01L 21/8238* (2006.01)
  *H01L 21/266* (2006.01)
(52) U.S. Cl.
  CPC .............. *H01L 21/76237* (2013.01); *H01L 21/823892* (2013.01); *H01L 27/0921* (2013.01); *H01L 27/0922* (2013.01); *H01L 27/0924* (2013.01); *H01L 27/0928* (2013.01); *H01L 29/1083* (2013.01); *H01L 29/1087* (2013.01); *H01L 21/76202* (2013.01); *H01L 21/823878* (2013.01)

(56) References Cited

U.S. PATENT DOCUMENTS

| | | | |
|---|---|---|---|
| 7,304,354 | B2 | 12/2007 | Morris |
| 7,629,654 | B2 | 12/2009 | Morris |
| 7,804,138 | B2 | 9/2010 | Morris |
| 8,093,145 | B2 | 1/2012 | Morris |
| 8,252,642 | B2 | 8/2012 | Morris |
| 8,278,719 | B2 | 10/2012 | Morris |
| 8,497,195 | B2 | 7/2013 | Morris |
| 8,729,640 | B2 | 5/2014 | Morris |
| 2003/0173609 | A1* | 9/2003 | Kaneko ............... H01L 27/0623 257/299 |
| 2011/0215402 | A1 | 9/2011 | Lee |
| 2011/0309333 | A1 | 12/2011 | Cheng et al. |
| 2015/0380483 | A1* | 12/2015 | Mallikarjunaswamy ................... H01L 29/0692 257/494 |
| 2016/0153932 | A1* | 6/2016 | Eklund ............... G01N 27/414 257/253 |
| 2016/0268245 | A1* | 9/2016 | Chen ................ H01L 27/0248 |
| 2020/0152578 | A1* | 5/2020 | Gifford ............... H01L 29/36 |

OTHER PUBLICATIONS

"Notification of Transmittal of the International Search Report and the Written Opinion of the International Searching Authority, or the Declaration in PCT Application No. PCT/US19/59753", dated Feb. 27, 2020, 1 Page.

"Written Opinion of the International Searching Authority in PCT Application No. PCT/US19/59753", dated Feb. 27, 2020, 6 Pages.
"Search History in PCT Application No. PCT/US19/59753", dated Feb. 27, 2020, 4 Pages.
Aoki, Takahiro, "A Practical High-Latchup Immunity Design Methodology for Internal Circuits in the Standard Cell-Based CMOS/BiCMOS LSI's," in IEEE Transactions on Electron Devices, vol. 40, No. 8, Aug. 1993, pp. 1432-1436.
Okazaki, Yukio, et al., "Characteristics of a New Isolated p-Well Structure Using Thin Epitaxy Over the Buried Layer and Trench Isolation," in IEEE Transactions on Electron Devices, vol. 39, No. 12, Dec. 1992, pp. 2758-2764.
Ikeda, Takahide, et al., "High-Speed BiCMOS Technology with a Buried Twin Well Structure," in IEEE Transactions on Electron Devices, vol. ED-34, No. 6, Jun. 1987, pp. 1304-1310.
Uffmann, D., et al., "Latchup Design Precautions for 1.0 Micron Junction Isolated CMOS ASICS Operating at Temperatures Up to 525K," Published in ESSDERC '94: 24th European Solid State Device Research Conference , Sep. 1994, pp. 675-678.
"Invitation to Pay Additional Fees and, Where Applicable, Protest Fee Issued in PCT Application No. PCT/US19/59753", dated Jan. 2, 2020, 2 Pages.
"Non-Final Rejection Issued in U.S. Appl. No. 16/183,909", dated Mar. 9, 2020, 15 pages.
"Notice of Allowance and Fee(s) due Issued in U.S. Appl. No. 16/183,909", dated Jul. 1, 2020, 9 pages.
Lewis, Alan G., et al., "Latchup Performance of Retrograde and Conventional n-Well CMOS Technologies," in IEEE Transactions on Electron Devices, vol. ED-34, No. 10, Oct. 1987, pp. 2156-2164.
Ker, Ming-Dou, et al., "New Experimental Methodology to Extract Compact Layout Rules for Latchup Prevention in Bulk CMOS IC's," Published in Proceedings of the IEEE 1999 Custom Integrated Circuits Conference, May 1999, 4 pages.
Rubin, Leonard M., et al., "Process Architectures Using MeV Implanted Blanket Buried Layers for Latch-Up Improvements on Bulk Silicon," in Proceedings of 11th International Conference on Ion Implantation Technology, Jun. 1996, 4 pages.
Sleeter, David J., et al., "The Relationship of Holding Points and a General Solution for CMOS Latchup," in IEEE Transactions on Electron Devices, vol. 39, No. 11, Nov. 1992, pp. 2592-2599.
"International Search Report and Written Opinion Issued in PCT Application No. PCT/US2019/059753", dated May 20, 2021, 7 Pages.

\* cited by examiner

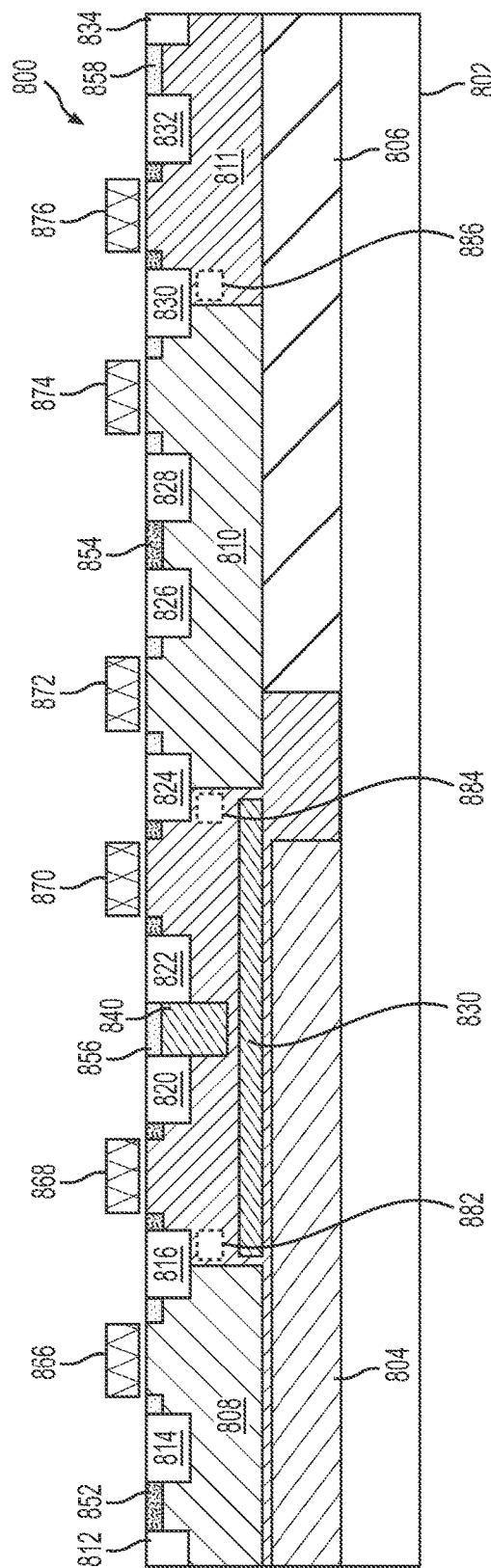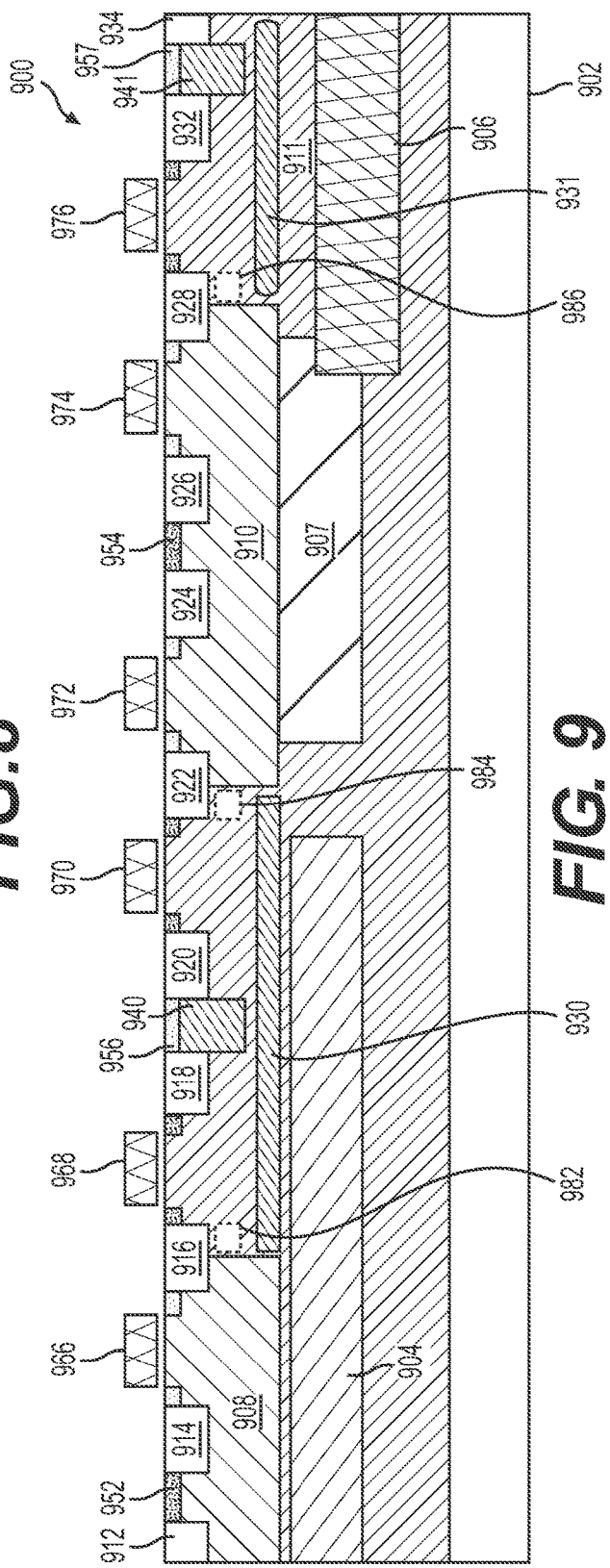
FIG. 8
FIG. 9

STRUCTURES FOR IMPROVING RADIATION HARDNESS AND ELIMINATING LATCH-UP IN INTEGRATED CIRCUITS

CROSS-REFERENCE TO RELATED APPLICATION(S)

This application is a continuation of U.S. patent application Ser. No. 16/183,909, filed on Nov. 8, 2018, entitled "STRUCTURES FOR IMPROVING RADIATION HARDNESS AND ELIMINATING LATCH-UP IN INTEGRATED CIRCUITS," the entire contents of which are hereby incorporated herein by reference.

BACKGROUND

Increasingly CMOS devices are being deployed in extreme environmental conditions that are present in applications such as avionics, downhole drilling, alternative energy, and Internet of Things (IoT) solutions. A major challenge facing designers of such systems is that many of the commercial integrated circuits used to build such systems are not rated for operation at high temperature.

In addition, all bulk CMOS devices are subject to latch-up. Latch-up effects may range from transient failures, which upset the logic state of the circuit, to functionally disabling regions of the circuit or destroying the device (hard failure). Latch-up may occur due to parasitic devices that are created across a bulk CMOS wafer that become problematic when there is a transient event that has the effect of switching on the parasitic structure. Typically, the parasitic structure resembles a silicon-controlled rectifier (SCR) including a p-n diode. Increasing temperature reduces the forward bias voltage of the p-n diode, making it easier for a transient event (neutron, single over-voltage, current noise, or single particle) to trigger the parasitic bi-polar transistor structure into an "on" state. The reduction of the diode forward bias caused by the increasing temperature reduces latch-up trigger current as the diode is more easily forward biased and this leads to increased possibility of failure. In other words, as temperature is increased, the integrated circuit may become more susceptible to latch-up because the initiating devices are more easily activated with increasing temperature. This may lead to increased transient failures ranging from micro-latch triggering, destructive latch-up, or simple forward diode conduction (high leakage). At the same time, CMOS devices are increasingly being made smaller via die shrinks, Moore's Law process migrations, and other methodologies. This is particularly a problem with respect to die that are subject to harsh operating conditions, including widely varying operating temperatures or other environmental conditions, such as radiation.

When radiation strikes an integrated circuit (IC), charge is generated in both the insulator and the semiconductor regions. Charge created in both of these regions can affect operation and reliability of ICs. Some of the charge created in the substrate is collected by devices and nodes of the IC. This collected charge can disrupt circuit functionality temporarily or often, in the event of latch-up, permanently.

Accordingly, there is a need for structures, and processes for making such structures, for eliminating latch-up in integrated circuits as well as hardening them against the effects of radiation.

SUMMARY

In one example, the present disclosure relates to a process for making an integrated circuit in a substrate. The process may include forming a first doped buried layer. The process may further include forming a first well of a first conductivity type and a second well of the first conductivity type. The process may further include using a first mask, forming a second doped buried layer only in a first region above the first doped buried layer and between at least the first well and the second well, where the first mask is configured to control at least a first spacing between the second doped buried layer and the first well and a second spacing between the second doped buried layer and the second well. The process may further include using a second mask, different from the first mask, forming a vertical conductor located only in a second region above the first region and between at least the first well and the second well, where the vertical conductor is doped to provide a low resistance link between the second doped buried layer and at least a top surface of the substrate.

In another aspect, the present disclosure relates to an integrated circuit including a substrate, a first well of a first conductivity type, and a second well of the first conductivity type. The integrated circuit may further include a first doped buried layer, formed in the substrate, below each of the first well and the second well. The integrated circuit may further include a second doped buried layer formed only in a first region above the first doped buried layer and between at least the first well and the second well. The integrated circuit may further include a vertical conductor located only in a second region above the first region and between at least the first well and the second well, where the vertical conductor is doped to provide a low resistance link between the second doped buried layer and at least a top surface of the substrate.

In yet another aspect, the present disclosure relates to an integrated circuit including a substrate, a first well of a first conductivity type in the substrate, a second well of the first conductivity type formed in the substrate, a third well of the first conductivity type formed in the substrate below the second well, and a fourth well of a second conductivity type, different from the first conductivity type, formed in the substrate. The integrated circuit may further include a first doped buried layer, formed in the substrate, below at least the fourth well. The integrated circuit may further include a second doped buried layer formed in a first region above the first doped buried layer and between at least the first well and the second well. The integrated circuit may further include a first vertical conductor formed in a third region above the first region and between at least the first well and the second well, where the first vertical conductor is doped to provide a first low resistance link between the second doped buried layer and at least a top surface of the substrate. The integrated circuit may further include a second vertical conductor formed in a fourth region above the second region, where the second vertical conductor is doped to provide a second low resistance link between the third doped buried layer and at least the top surface of the substrate.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

FIG. 1 is a cross-section view of a portion of an integrated circuit during a manufacturing stage in accordance with one example;

FIG. 8 is a cross-section view of a portion of an integrated circuit during a manufacturing stage in accordance with one example;

FIG. 9 is a cross-section view of a portion of an integrated circuit during a manufacturing stage in accordance with one example.

DETAILED DESCRIPTION

Figure 1:
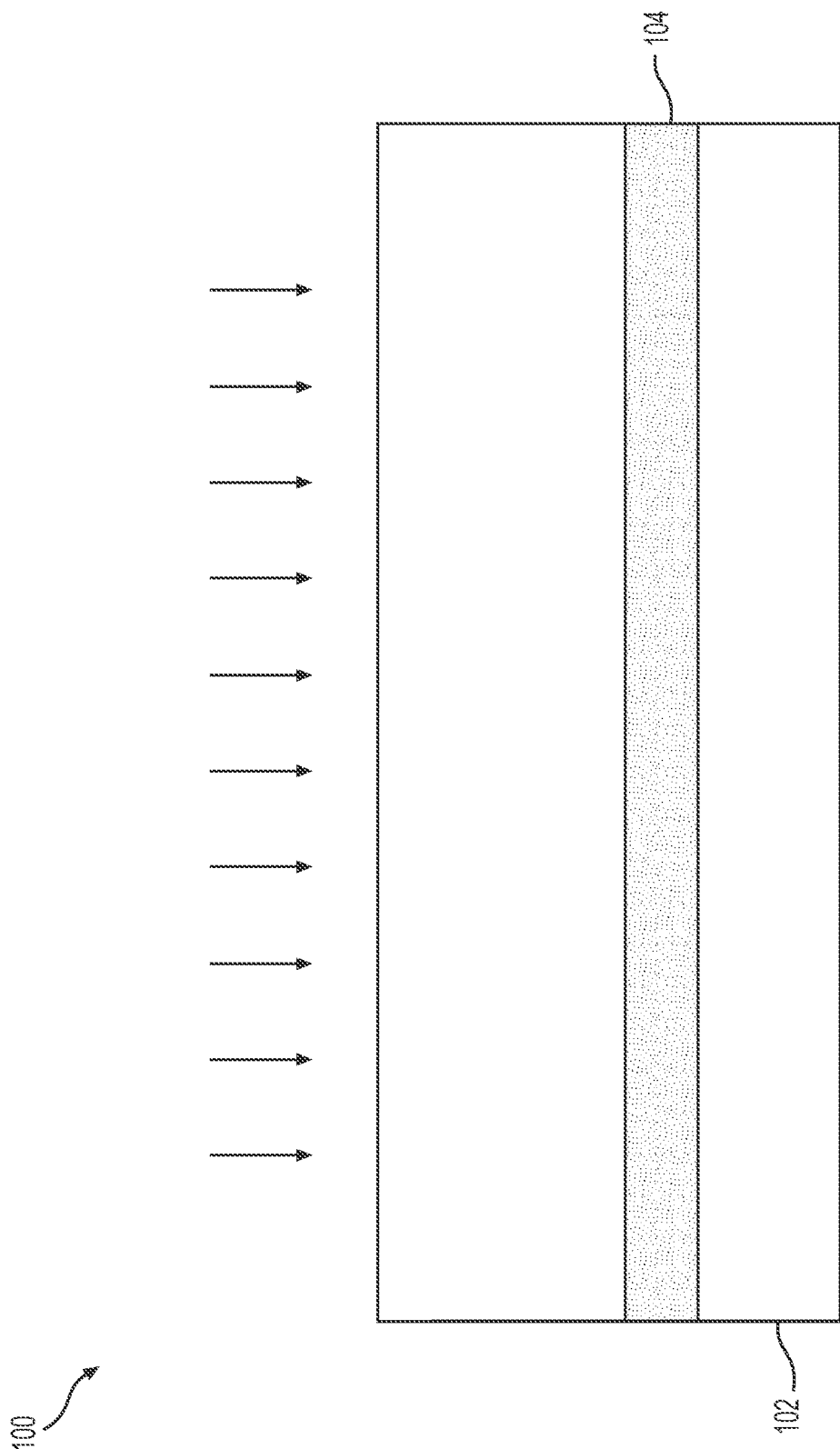

Examples described in this disclosure relate to integrated circuits and processes for manufacturing the integrated circuits. Integrated circuits include but are not limited to Field-Programmable Gate Arrays (FPGAs), Application-Specific Integrated Circuits (ASICs), Application-Specific Standard Products (ASSPs), System-on-a-Chip systems (SoCs), Complex Programmable Logic Devices (CPLDs), Digital-Signal Processors (DSPs), controllers (e.g., automotive controllers, communication controllers, IoT controllers), sensors, image sensors, or other types of integrated circuits.

Certain aspects of the disclosure also relate to buried guard ring structures for substantially improving radiation hardness of integrated circuits and for substantially eliminating latch-up in integrated circuits. Energetic radiation incident on an integrated circuit generates charge in both insulator and semiconductor regions. Charge created in both regions can affect operation and reliability of the IC in different ways. Some of the charge created in the device areas and the substrate does not recombine and is collected by devices and nodes of the IC. This collected charge causes current and voltage transients at the nodes where it is collected as well as related nodes. Transients which are sufficiently long, sufficiently large or which occur at times where the circuit is sufficiently vulnerable will disrupt correct operation of the circuit or memory temporarily or permanently. One method for lessening the potential impact of energetic particle strikes is to reduce the quantity of charge collected by the circuit nodes for any given energetic particle. As the magnitude and duration of the induced transient are reduced, the window of vulnerability for the circuit is reduced and the probability that circuit operation will be disrupted is also reduced.

Latch-up is a potentially destructive phenomenon which is driven by parasitic devices in CMOS technology. Parasitic elements include the respective resistances of the P-Well and the N-Well. These parasitic elements can cause latch-up in both parasitic PNP transistors and NPN transistors. In conventional bulk CMOS, the PNP transistor has the p+ source/drain as emitter, N-Well as the base, and the p-substrate and the P-Well as the collector. In this example, for the NPN transistor, the N-Well and the P-Well/substrate act as the collector and the base, respectively, while its emitter is the n+ source/drain. Latch-up can be triggered by either emitter. For example, if the n+ emitter is forward-biased, injected electrons may be collected by the N-Well. If the electron current is large enough, the induced potential drop in the N-Well resistor may forward-bias the p+/N-Well diode. The injected holes may now be collected by the P-Well contact. A large enough hole current through the P-Well resistor may ensure that the n+/P-Well diode remains forward-biased and injects more electrons to be collected by the N-Well. This positive feedback loop may lead to latch-up which, at best, may interrupt the correct functioning of the integrated circuit and, at worst, may destroy the integrated circuit. As the spacing between devices is reduced, latch-up may even be triggered at a higher rate.

The positive feedback previously described above can be degraded by either (1) reducing the resistances in order to ensure the induced potential drops are not enough to forward-bias the source/drain to the well emitter junctions or (2) decreasing the NPN and PNP transistor gains so that the injected emitter currents do not create enough collected current to forward-bias the opposite emitter or by using both of these techniques. As an example, in CMOS technology-based devices, as much of the degradation as possible may be done through the well doping profiles, but this will be constrained by the desired transistor parameters and well breakdown voltages. Additional degradation of the feedback loop may be accomplished through layout design rules that may ensure that the n+ and p+ emitters are kept far enough away from the N-Well/P-Well edge and each other. While these measures may reduce the likelihood of latch-up, they do not eliminate latch-up completely. In addition, the use of relaxed layout rules to reduce the probability of latch-up increases the area of the IC, thereby also potentially decreasing the manufacturing yield. Together, these two factors can increase the cost of the IC.

FIG. 1 is a cross-section view of a portion of an integrated circuit 100 during a manufacturing stage in accordance with one example. During this manufacturing stage, a doped buried layer 104 may be formed in part of all of a substrate 102. In one example, substrate 102 may be a p-type substrate and the dopants may have the same conductivity type as the substrate. Depending on process platform, doped buried layer 104 may be formed by implanting boron at 0.03 to 2.5 MeV for p-type buried layers and phosphorus at 0.08 to 3.5 MeV for n-type buried layers. In this example, implanted doses may be between approximately $1 \times 10^{13}$ to $1 \times 10^{16}$ $cm^{-2}$. In addition, after the implant, annealing (e.g., rapid thermal annealing (RTA)) and cleaning steps may be performed. Although FIG. 1 shows no isolation structures, this manufacturing step may be performed after the formation of isolation structures, such as trench isolation structures.

Figure 2:
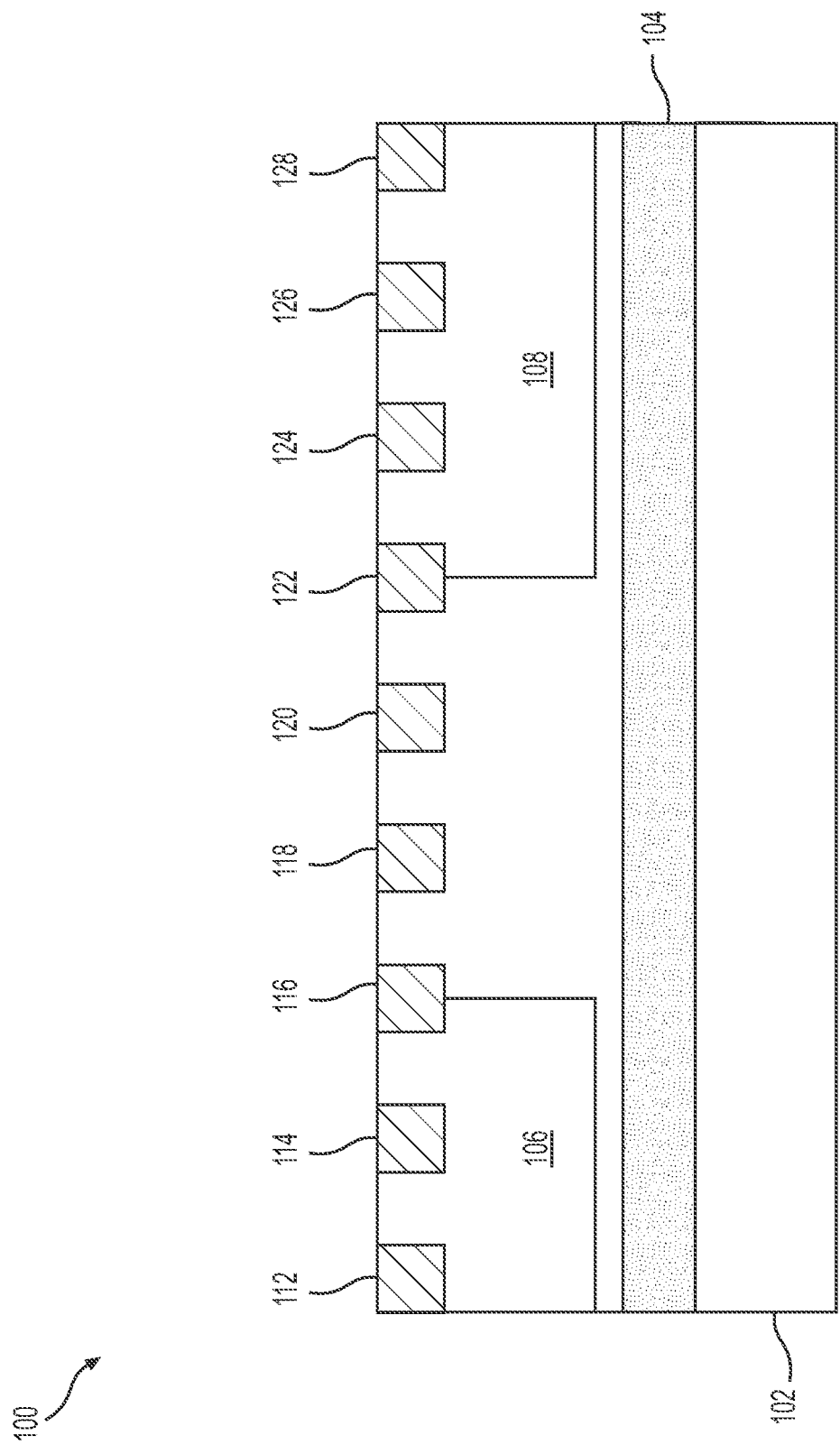
FIG. 2 is a cross-section view of a portion of an integrated circuit during a manufacturing stage in accordance with one example.

In addition, doped buried layer 104 may also be used with integrated circuits formed in silicon on insulator (SOI) substrates. In the case of an SOI substrate, a p-type semiconductor layer may be formed in the SOI substrate. A doped buried layer (e.g., doped burled layer 104) may then be formed in the p-type epitaxial layer by implanting boron or other similar impurities in the p-type epitaxial layer. If an n-type layer is formed, the buried layer can be formed with n-type dopants like phosphorus FIG. 2 is a cross-section view of a portion of an integrated circuit 100 during a manufacturing stage in accordance with one example. This cross-section view assumes that the substrate is a p-type substrate. Using another mask, N-Well 106 and N-Well 108 may be formed above doped buried layer 104. Optionally, the buried layer may have been formed under only some of the N-Wells or none in the N-Wells and only in some or all of the spaces between N-Wells. These N-Wells may be formed by implanting n-type dopants, such as phosphorous, arsenic, antimony, bismuth, or lithium into substrate 102. Additionally, P-Wells may be formed, optionally using a P-Well mask. Isolation structures 112, 114, 116, 118, 120, 122, 124, 126, and 128 may be formed by depositing insulating material and selectively removing portions of the insulating material. Insulating materials such as silicon dioxide, silicon nitride, or other similar insulation materials may be used. In one example, the isolation structures may be configured as shallow trench isolation (STI) structures. Instead of STIs, local oxidation of silicon (LOCOS) may also be used. In addition, although FIG. 2 shows the formation of insulation structures after the formation of doped buried layer 104, this step may be performed before the formation of doped buried layer 104.

Figure 3:
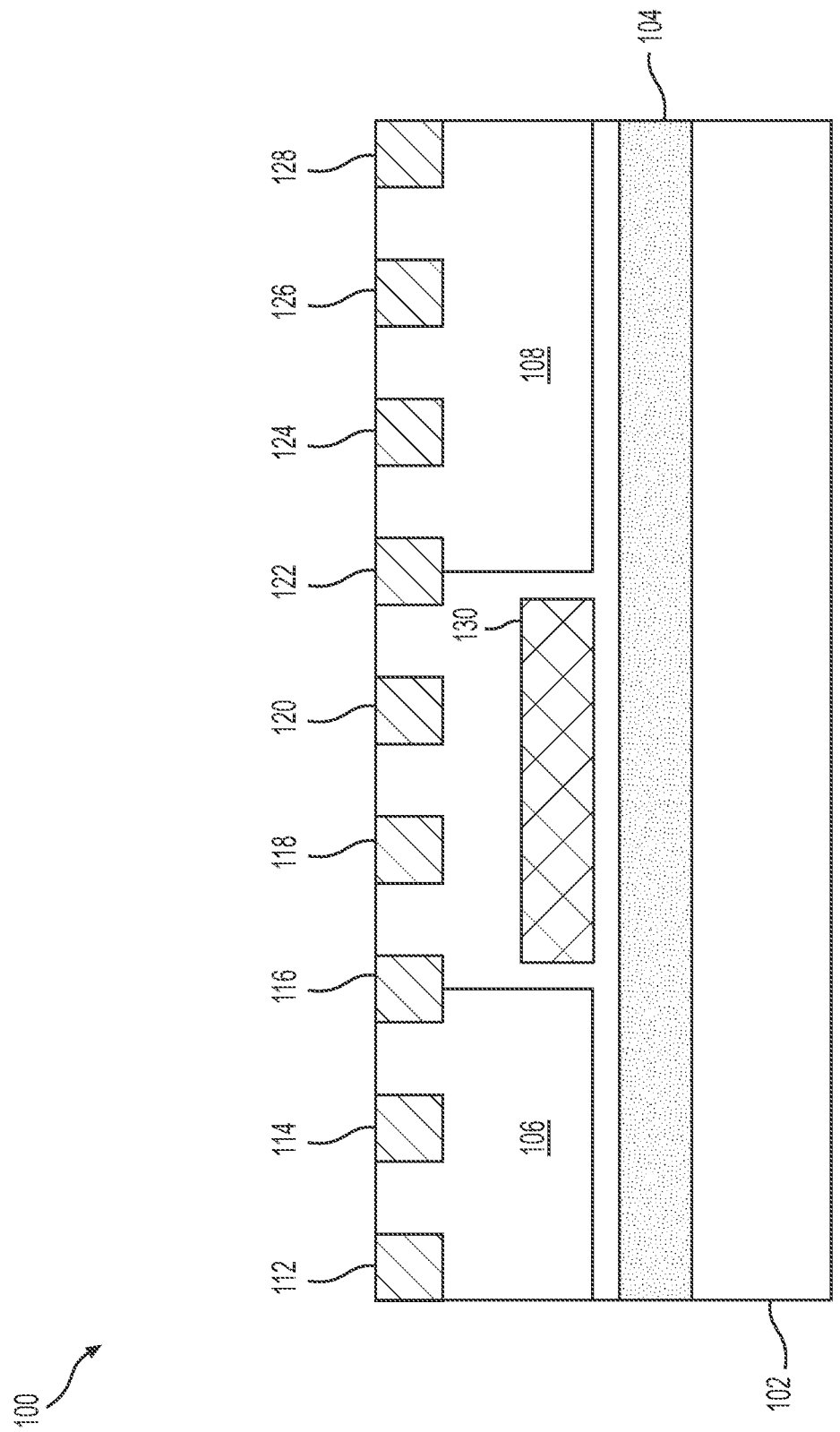
FIG. 3 is a cross-section view of a portion of an integrated circuit during a manufacturing stage in accordance with one example.

FIG. 3 is a cross-section view of a portion of an integrated circuit 100 during a manufacturing stage in accordance with one example. At this stage of manufacturing, an intermediate doped buried layer 130 may be formed. Using another mask, intermediate doped buried layer 130 may be formed above doped buried layer 104 and in specific regions of substrate 102. In this example, intermediate doped buried layer 130 may be formed between N-Wells 106 and 108. Intermediate doped buried layer 130 may be formed by implanting boron at 30 keV to 2.4 MeV for p-type intermediate doped buried layers and phosphorus at 80 keV to 3.4 MeV for n-type intermediate doped buried layers. In this example, implanted doses may be between approximately $1\times10^{12}$ to $5\times10^{15}$ cm$^{-2}$. In this example, intermediate doped buried layer 130 may advantageously provide a localized increase in an effective thickness (along a vertical direction, as shown in FIG. 3) of a doped region formed in conjunction with buried doped layer 104. This localized increase may present a larger collection cross-section to the injected charge and thus increase its collection within the combination of buried doped layers 130 and 104. The increased collection of the injected charge reduces the charge collected at circuit nodes, improving the ability of the circuit to resist energetic particles and its radiation hardness. The buried doped layers, singly and in combination, may help prevent latch-up at least because they decrease the P-Well resistance and the gain of the parasitic NPN transistor involved in triggering and sustaining latch-up. In one example, intermediate doped buried layer 130 and P-Wells could be formed simultaneously by using the P-Well mask by adjusting the P-Well mask. Thus, in one example process, using the same mask, dopant implantation corresponding to intermediate doped buried layer 130 may be performed at the same time as the dopant implementation for the P-Wells. This may advantageously reduce the number of masks required to create the P-Wells, the N-Wells, and the intermediate doped buried layer structures. The number of masks and manufacturing cost may be further reduced by not using a mask to create intermediate buried layer 130. In this case, the dopant in N-Wells 106 and 108 is adjusted to compensate the dopant in intermediate buried layer 130 so they remain n-type.

Figure 4:
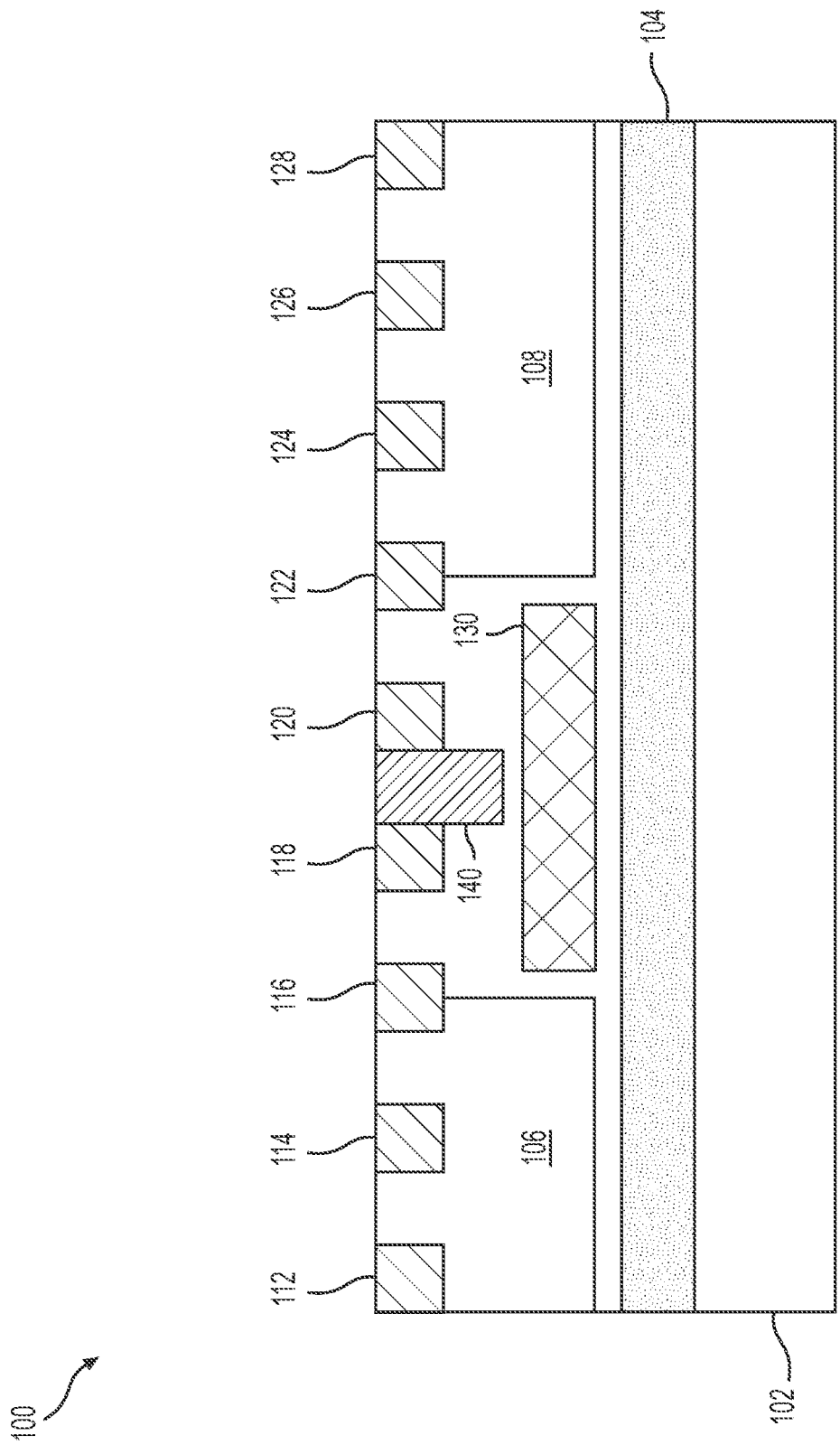
FIG. 4 is a cross-section view of a portion of an integrated circuit during a manufacturing stage in accordance with one example.

FIG. 4 is a cross-section view of a portion of an integrated circuit 100 during a manufacturing stage in accordance with one example. At this manufacturing stage, another latch-up elimination structure may be formed. In this example, a vertical doping conductor 140 may be formed. Vertical doping conductor 140 may be formed using a different mask than used for forming intermediate doped buried layer 130. Vertical doping conductor 140 may provide a low-resistance link between intermediate doped buried layer 130 and a top surface of substrate 102. Depending on the process platform, vertical doping conductor 140 may be made with one implant or a chain of multiple implants of different energies. Two such examples are a p-type vertical doping conductor 140 formed by a single boron implant with dose between $1\times10^{13}$ and $1\times10^{15}$ and energy between 25 keV and 150 keV and a p-type vertical doping conductor 140 formed by a chain of two boron implants, one with dose between $1\times10^{13}$ and $1\times10^{15}$ and energy between 25 keV and 150 keV and a second with dose between $1\times10^{13}$ and $1\times10^{15}$ and energy between 150 keV and 600 keV. Vertical doping conductor 140 may also provide a low-resistance link between intermediate doped buried layer 130 and source/drain implants for the transistors or other active devices or other contact regions formed in substrate 102.

Figure 5:
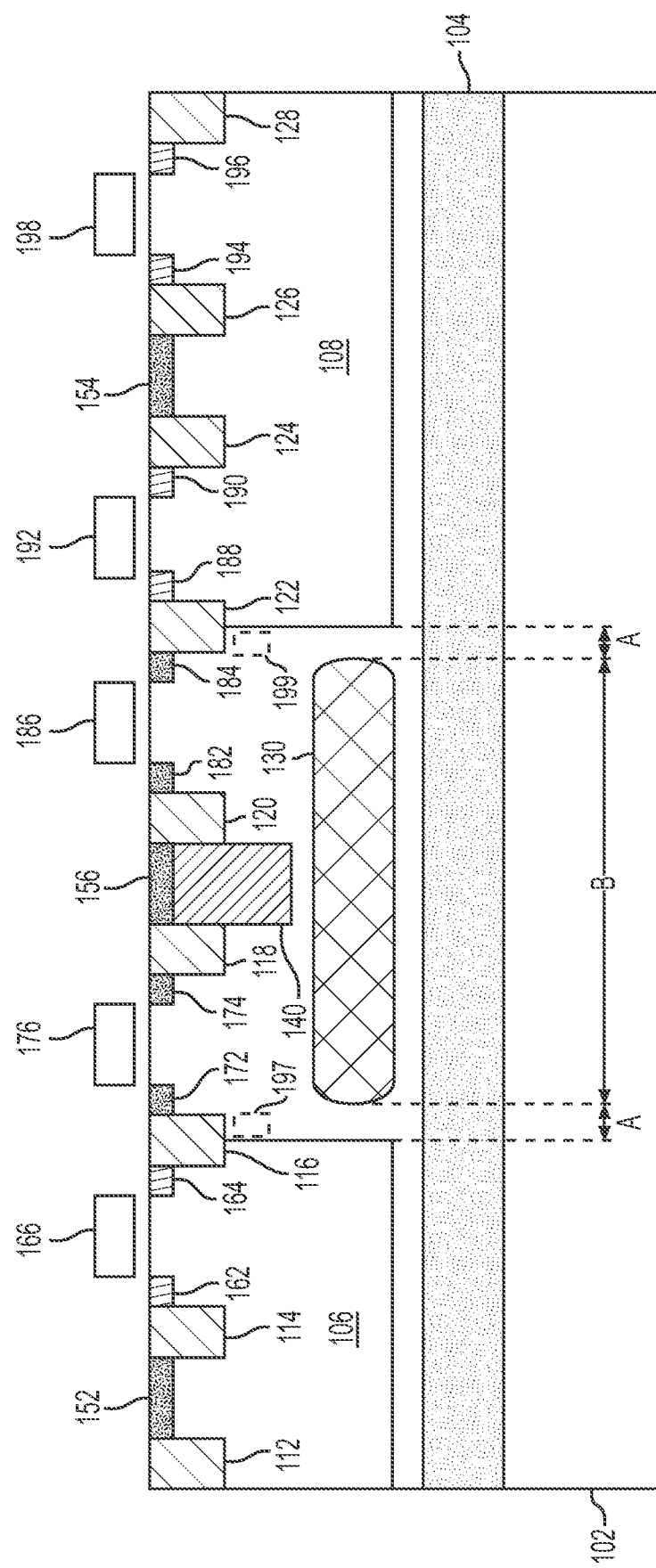
FIG. 5 is a cross-section view of a portion of an integrated circuit during a manufacturing stage in accordance with one example.

FIG. 5 is a cross-section view of a portion of an integrated circuit 100 during a manufacturing stage in accordance with one example. At this manufacturing stage, integrated circuit 100 is shown with the source/drain regions formed and contacts, including well taps, formed. The source/drain regions 162, 164, 172, 174, 182, 184, 188, 190, 194, and 196 may be formed using masked doping of these regions. Well taps, including N-Well tap 152, N-Well tap 154, and buried-guard ring (BGR) P-Well tap 156 may be formed in separate masked doping steps with N-Well taps 152 and 154 potentially being formed simultaneously with n-type source/drain regions 172, 174, 182 and 184 to minimize manufacturing cost. In this example, a desired bias may be applied to BGR P-Well tap 156 during use of the completed IC to collect, through buried doped layers 130 and 104 and vertical doping conductor 140, any charge generated in substrate 102. The combination of buried layer 104, intermediate doped buried layer 130 and vertical doping conductor 140 creates a low resistance path that improves the collection of charge in substrate 102 that would otherwise disturb the devices and circuits formed in substrate 102. Thus, in this example, even though charge may be created by energetic particle strikes, an electrical disturbance, or leakage current, the low resistance path helps remove the charge, safeguarding devices and circuits in integrated circuit 100. In this manner, buried layer 104, intermediate doped buried layer 130 and vertical doping conductor 140 improve radiation hardness of integrated circuit 100 and eliminate latch-up enabling integrated circuit 100 to operate at higher temperatures than conventional ICs. In addition to providing a low resistance path from the substrate and buried layer 104 to a biasing terminal (e.g., BGR P-Well tap 156) thereby increasing charge collection, intermediate doped buried layer 130 increases the effective thickness and charge collection and recombination capability of buried doped layer 104 in regions of integrated circuit 100 where both are present. This is because the increased effective thickness presents a larger cross-section to the injected charge and increases its collection and recombination. This in turn further improves radiation hardness.

With continued reference to FIG. 5, the latch-up elimination structures 130 and 156, shown in FIG. 5, require lower implantation energies and/or doses compared with other radiation hardening and latch-up mitigation structures. The use of a higher implantation energy and/or dose in such conventional radiation hardening and latch-up mitigation structures requires the use of thicker blocking layers of photoresist and larger limits on the minimum size of the spacing between adjacent photoresist blocks as well as on the minimum size of openings in the photoresist layer, which results in larger minimum sizes for the conventional radiation hardening and latch-up elimination structures. In addition, in such conventional arrangements, the greater lateral straggle of the higher energy and/or dose implanted buried layers leads to larger minimum spacing rules between the implanted buried layers and neighboring regions, including active regions and the wells of the opposite doping. These minimum spacing rules and the larger minimum required size rules limit the areas of an integrated circuit in which such conventional radiation hardening latch-up mitigation structures can be formed, decreasing the total number and density of such structures in the IC and, potentially, the achievable robustness. For new designs, the larger dimensions of conventional latch-up and radiation hardening structures mean a larger IC in order to achieve the desired robustness. The use of an intermediate buried doped layer 130 alleviates these issues. This is because a structure such as an intermediate buried doped layer 130 can even be placed within the P-Well and active areas it contains, which in turn removes the spacing rules imposing spacing requirements with respect to active regions and the well. In addition, intermediate buried doped layer 130 may advantageously enable the use of thinner photoresist blocking layers and smaller photoresist openings while simultaneously relaxing the need for smaller openings by occupying P-Well area above buried doped later 104. The removal of these constraints during the manufacture of integrated circuit 100 may allow intermediate buried doped layer 130 to be used in smaller areas of integrated circuit 100. Minimum spacing A, however is still required between each edge of intermediate doped buried layer 130 (whatever the size of opening B) to a respective N-Well (e.g., N-Wells 106 and 108) but may be made smaller in magnitude for intermediate doped buried layers 130 with low enough doping. The radiation hardening and latch-up elimination structures shown in FIG. 5 decrease the area required to form such structures and thus they can be placed with a higher density of taps adequate to remove a sufficient amount of the generated charge from substrate 102 to ensure the desired level of radiation hardness and/or latch-up robustness.

Still referring to FIG. 5, additional implants 197 and 199 may be performed to increase the total integrated dose (TID) capability for the integrated circuit. As the integrated circuit is bombarded by energetic particles, these particles create electron-hole pairs in the dielectric regions of the integrated circuit. A certain fraction of the electron-hole pairs can get trapped in the dielectric. The movement of the holes through the dielectric can also release hydrogen ions, which can themselves create interface states that further enhance charge trapping in the dielectric regions of the integrated circuit. Eventually, when enough positive charge has been trapped in the dielectric the voltage at the silicon surface inverts. The inversion layers provide leakage paths for current between n-type source and drain regions and between N-Well regions and adjacent n-type source/drain regions. As the integrated dose increases, so do the amount of the trapped charge, the degree of inversion, and the leakage current. until the leakage current exceeds that specified for the integrated circuit (IC). Implants 197 and 199 are placed under the Field Isolation in specific areas in addition to the standard Field Threshold Implants in the CMOS process in order to decrease the degree of inversion and the leakage current in those areas for any integrated dose and allow the IC to remain functional to higher total integrated dose. These implants can be placed only around the perimeters of N-Well regions between the N-Wells and external N+ Source/Drain regions, in the P-Well regions where the Active spacing is large enough to accommodate the additional doping or in both areas. Implants 197 and 199 may be implanted with a dedicated mask. Implants 197 and 199 increase the total integrated dose (TID) for the integrated circuit and work in conjunction with the other radiation hardening and latch-up elimination structures to improve the reliability of the integrated circuit when exposed to radiation.

Figure 6:
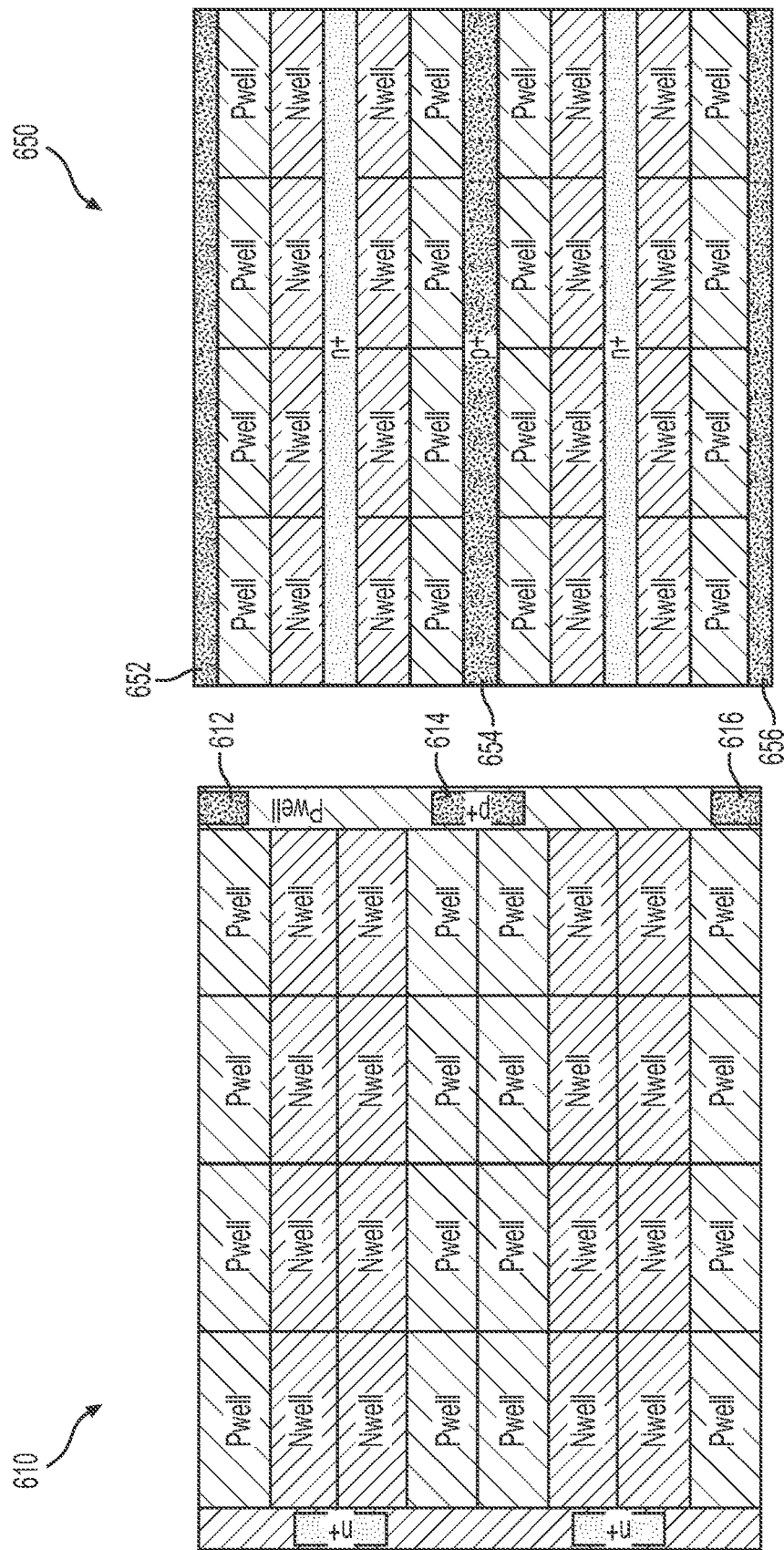
FIG. 6 is a diagram showing a top view of portions of an integrated circuit in accordance with one example.

FIG. 6 is a diagram showing top views 610 and 650 of portions of integrated circuit 100 in accordance with one example. As shown in FIG. 6, latch-up elimination and radiation hardening structures described with respect to FIGS. 1-5 may be formed in smaller areas than possible before. Top views 610 and 650 show the formation of these structures in an example where the striped cell layout is used during the manufacture of integrated circuit 100. As shown in FIG. 6, in top view 610, Buried Guard Ring (BGR) tap contacts 612, 614, and 616 may be formed. In a conventional standard cell library, the P-well stripes in which BGR tap contacts 612, 614 and 616 are formed would be as narrow as possible in order to maximize the efficiency of the standard cell library and minimize the size of any IC which is designed using it. Therefore, in a conventional standard cell library, the P-well stripes are unlikely to be able to support the conventional larger vertical doping conductors. In order to use conventional latch-up elimination and radiation hardening structures in new products, special cells with wider P-well stripes would need to be constructed and included in the standard cell library used for their synthesis. In addition, existing products designed with such standard cell libraries are unlikely to be able to accommodate retrofitting of conventional latch-up elimination and radiation hardening in sufficient density since, as previously explained, their larger spatial extent prevents insertion in most or all of the existing P-well stripes. In contrast, the narrower lateral extent of structure 140, as shown in FIG. 5, means that these structures can be constructed within the P-well stripes and contacted from above by structures 612, 614 and 616. In addition, the paired P-wells created by the common practice of reflecting the standard cell rows generate the spacing of N-well regions to house structures 130, as shown in cross-section in FIG. 5. This allows the new latch-up elimination and radiation hardening structures to be used with conventional standard cell libraries with little to no area penalty.

Still referring to FIG. 6, top view 650 shows an IC portion, in which Buried Guard Ring (BGR) tap contacts 652, 654, and 656 may be formed. Although BGR tap contacts 652, 654 and 656 are shown as continuous regions, they may instead be implemented as discontinuous, discrete regions. The smaller lateral spacing needed to implement BGR tap contacts 652, 654 and 656 enables their use with no (in a majority of designs) or little change to the standard cell library. In one embodiment, the standard logic of the IC is synthesized with the standard cell library but with the BGR tap contacts 652, 654 and 656 sandwiched between adjacent P-wells, as opposed to perpendicular to them, as in top view 610 of an IC portion. The adjacent P-wells create the room for latch-up elimination and radiation hardening structure 130, as shown in FIG. 5, without additional area being required. This eliminates or renders very small the additional area required in standard cell synthesis to implement the presently described latch-up elimination and radiation hardening structures as compared to the larger area required to implement the conventional structures which then drives the use of larger standard cells. As described earlier, depending upon the requirements for the integrated circuit, any of these well taps may be used to apply a bias to the integrated circuit in a manner that allows removal of any accumulated charge from the substrate corresponding to the integrated circuit.

Figure 7:
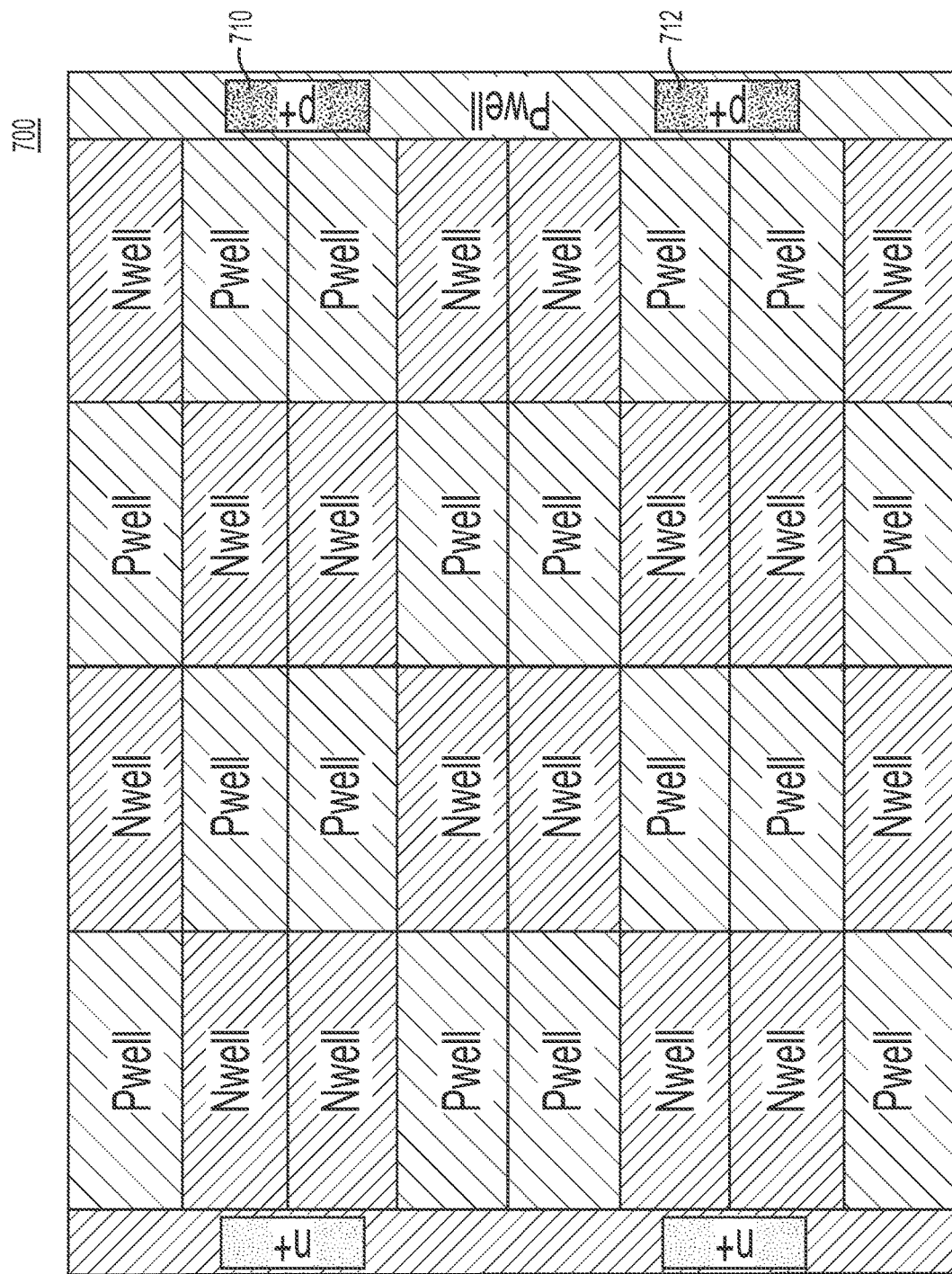
FIG. 7 is a diagram showing a top view of a portion of an integrated circuit in accordance with one example.

FIG. 7 is a diagram showing a top view 700 of an IC portion of in accordance with one example. This example shows the formation of latch-up elimination structures described with respect to FIGS. 1-5 in an example where the checkerboard cell layout is used during the manufacture of integrated circuit 100. As shown in FIG. 7, Buried Guard Ring (BGR) tap contacts 710 and 712 may be formed in the existing P-well stripes, as shown in FIG. 5, by taking advantage of the space created by N-well separation created through the pairing of P-wells in the checkerboard pattern. The latch-up elimination and radiation hardening structures of the present disclosure, exemplified by structures 140 and 130 in FIG. 5, can be formed wherever paired P-wells are formed. However, in the checkerboard layout, there is an area penalty incurred in order to contact every instance of paired P-wells. Alternatively, some pairs can be left uncontacted by BGR tap contact regions like 710 and 712 at the cost of latch-up elimination and radiation hardening performance. As described earlier, depending upon the requirements for the integrated circuit, any of these well taps may be used to apply a bias to the integrated circuit in a manner that allows removal of any accumulated charge from the substrate corresponding to the integrated circuit.

FIG. 8 is a cross-section view of a portion of an integrated circuit 800 during a manufacturing stage in accordance with one example. This cross-section view assumes that substrate 802 is a p-type substrate. Using a mask, a deep N-Well 806 may be formed in substrate 802. A doped buried layer 804 may be formed optionally using the same mask as the mask used for forming deep N-Well 806. Using another mask, N-Well 808 and N-Well 810 may be formed above doped buried layer 804. These wells may be formed by implanting n-type dopants, such as phosphorous, arsenic, antimony, bismuth, or lithium into substrate 802. In addition, at the same time or later, P-Well 811 may be formed. Isolation structures 812, 814, 816, 820, 822, 824, 826, 828, 830, 832, and 834 may be formed by growing and/or depositing insulating material and selectively removing portions of the insulating material. Insulating materials such as silicon dioxide, silicon nitride, or other similar insulation materials may be used. In one example, the isolation structures may be configured as shallow trench isolation (STI) structures. Instead of STIs, local oxidation of silicon (LOCOS) may also be used.

With continued reference to FIG. 8, an intermediate doped buried layer 830 may be formed. Using another mask, intermediate doped buried layer 830 may be formed above doped buried layer 804 and in specific regions of substrate 802. In this example, intermediate doped buried layer 830 may be formed between N-Wells 808 and 810. Intermediate doped buried layer 830 may be formed by implanting boron at 0.03 to 2.4 MeV for p-type doped buried layers and phosphorus at 0.08 to 3.4 MeV for n-type doped buried layers. In this example, implanted doses may be between approximately $1\times10^{13}$ to $5\times10^{15}$ cm$^{-2}$. In this example, like other examples discussed earlier, intermediate doped buried layer 830 may advantageously provide a localized increase in an effective thickness (along a vertical direction) of a doped region formed in conjunction with buried doped layer 804. This localized increase may present a larger collection cross-section to the injected charge and thus increase its collection. The increased collection of the injected charge may help prevent latch-up and decrease susceptibility to radiation-induced effects.

Still referring to FIG. 8, in this example, a vertical doping conductor 840 may be formed. Vertical doping conductor 840 may be formed using a different mask than used for forming intermediate doped buried layer 830. Vertical doping conductor 840 may provide a low-resistance link between intermediate doped buried layer 830 and a top surface of substrate 802. Depending on the process platform, vertical conductor 840 may be made with one implant or a chain of multiple implants of different energies. Two such examples are a p-type conductor 840 formed by a single boron implant with dose between $1\times10^{13}$ and $1\times10^{15}$ and energy between 25 keV and 150 keV and a conductor 840 formed by a chain of two boron implants, one with dose between $1\times10^{13}$ and $1\times10^{15}$ and energy between 25 keV and 150 keV and a second with dose between $1\times10^{13}$ and $1\times10^{15}$ and energy between 150 keV and 600 keV. Vertical doping conductor 840 may also provide a low-resistance link between intermediate doped buried layer 830 and source/drain implants for the transistors or other active devices formed in substrate 802. In addition, next source/drain regions and contacts, including well taps may be formed. Well taps, including N-Well tap 852, N-Well tap 854, buried-guard ring (BGR) P-Well tap 856, and isolated P-Well tap 858 may be formed. In this example, a desired bias may be applied to BGR P-Well tap 856 to collect any charges that are generated by either radiation or electrical stimuli in substrate 802 with respect to devices that are not formed in isolated P-Well 811. The combination of intermediate doped buried layer 830 and vertical doping conductor 840 may create a low resistance path that improves the collection of charge in substrate 802 that would otherwise disturb the devices and circuits formed in substrate 802. Thus, in this example, even though charge may be created by energetic particle strikes, an electrical disturbance, or leakage current, the low resistance path helps remove the charge. In this manner, intermediate doped buried layer 830 and vertical doping conductor 840 improve radiation hardness of integrated circuit 802 and eliminate latch-up even when integrated circuit 800 is operating at higher temperatures than most devices. In addition to providing a low resistance path from the substrate to a biasing terminal (e.g., BGRP-Well tap 856), intermediate doped buried layer 830 increases the effective thickness of buried doped layer 804 in regions of integrated circuit 800 where charge collection and removal is desired. This is because the increased effective thickness presents a larger cross-section to the injected charge and increases its collection. This, in turn, further improves radiation hardness and latch-up mitigation.

Still referring to FIG. 8, additional implants 882, 884, and 886 may be performed to increase the total integrated dose (TID) for the integrated circuit. As the integrated circuit is bombarded by energetic particles, these particles create electron-hole pairs in the dielectric regions of the integrated circuit. A certain fraction of the electron-hole pairs can get trapped in the dielectric. The movement of the holes through the dielectric can also release hydrogen ions, which can themselves create interface states that further enhance charge trapping in the dielectric regions of the integrated circuit. Eventually, when enough positive charge has been trapped in the dielectric the voltage at the silicon surface inverts. The inversion layers provide leakage paths for current between n-type source and drain regions and between N-Well regions and adjacent n-type source/drain regions. As the integrated dose increases, so do the amount of the trapped charge, the degree of inversion, and the leakage current until the leakage current exceeds that specified for the integrated circuit (IC). Implants 882, 884 and 886 are placed under the Field Isolation in specific areas in addition to the standard Field Threshold Implants in the CMOS process in order to decrease the degree of inversion and the leakage current in those areas for any integrated dose and allow the IC to remain functional to higher total integrated dose. These implants can be placed only around the perimeters of N-Well regions between the N-Wells and external N+ Source/Drain regions, in the P-Well regions where the Active spacing is large enough to accommodate the additional doping or in both areas. Implants 882, 884 and 886 may be implanted with a dedicated mask. Implants 882, 884 and 886 increase the total integrated dose (TID) for the integrated circuit and work in conjunction with the other radiation hardening and latch-up elimination structures to improve the reliability of the integrated circuit when exposed to radiation.

FIG. 9 is a cross-section view of a portion of an integrated circuit 900 during a manufacturing stage in accordance with one example. This cross-section view assumes that substrate 902 is a p-type substrate, although an analogous structure can be constructed with an n-type substrate. Using a mask, a deep N-Well 906 may be formed in substrate 902. Another deep N-Well implant 907 may be performed that is not as deep as deep N-Well 906. A doped buried layer 904 may be formed using the same mask as the mask used for forming deep N-Well 906. Alternatively, doped buried layer 904 may be formed using a dedicated mask. Using another mask, N-Well 908 and N-Well 910 may be formed above doped buried layer 904. These wells may be formed by implanting n-type dopants, such as phosphorus, arsenic, antimony, bismuth, or lithium into substrate 902. Isolation structures 912, 914, 916, 918, 920, 922, 924, 926, 928, 932, and 934 may be formed by depositing insulating material and selectively removing portions of the insulating material. Insulating materials such as silicon dioxide, silicon nitride, or other similar insulation materials may be used. In one example, the isolation structures may be configured as shallow trench isolation (STI) structures. Instead of STIs, local oxidation of silicon (LOCOS) may also be used.

With continued reference to FIG. 9, an intermediate doped buried layer 930 and another intermediate doped buried layer 931 may be formed. Using a single mask or two different masks, intermediate doped buried layers 930 and 931 may be formed above doped buried layer 904 and in specific regions of substrate 902. In this example, intermediate doped buried layer 930 may be formed between N-Wells 908 and 910 and intermediate doped buried layer 931 may be formed between N-Well 910 and another N-Well (not shown), above at least a portion of deep N-Well 906. A P-Well 911 may be formed at the same time or later. Intermediate doped buried layers 930 and 931 may be formed by implanting boron at 0.03 to 2.4 MeV for p-type intermediate doped buried layers and phosphorus at 0.08 to 3.4 MeV for n-type intermediate doped buried layers. In this example, implanted doses may be between approximately $1 \times 10^{13}$ to $5 \times 10^{15}$ cm$^{-2}$. In this example, like other examples discussed earlier, intermediate doped buried layer 930 may advantageously provide a localized increase in an effective thickness (along a vertical direction) of a doped region formed in conjunction with buried doped layer 904 while intermediate doped buried layer 931 plays the role of buried doped layer 904 for devices formed within P-Well 911. This localized increase may present a larger collection cross-section to the injected charge and thus increase its collection. The increased collection of the injected charge may help prevent latch-up. For devices formed within P-Well 911, intermediate doped buried layer 931 in conjunction with vertical doped conductor 941 enables efficient collection for the charge generated within P-Well 911, providing radiation and latch-up robustness.

Still referring to FIG. 9, in this example, vertical doping conductors 940 and 941 may be formed. Vertical doping conductors 940 and 941 may be formed using a different mask than used for forming intermediate doped buried layers 930 and 931. Vertical doping conductors 940 and 941 may provide low-resistance links between intermediate doped buried layers 930 and 931, respectively, and a top surface of substrate 902. Depending on the process platform, vertical doping conductors 940 and 941 may be made with one implant or a chain of multiple implants of different energies. Two such examples are p-type conductors 940 and 941 formed by a single boron implant with dose between $1 \times 10^{13}$ and $1 \times 10^{15}$ and energy between 25 keV and 150 keV and conductors 940 and 941 formed by a chain of two boron implants, one with dose between $1 \times 10^{13}$ and $1 \times 10^{15}$ and energy between 25 keV and 150 keV and a second with dose between $1 \times 10^{1}$ and $1 \times 10^{15}$ and energy between 150 keV and 600 keV. To minimize cost, vertical conductors 940 and 941 may be formed simultaneously. However, in some processes, it might be advantageous to form them with different implant steps to separately optimize vertical doping conductors 940 and 941. Vertical doping conductors 940 and 941 may also provide low-resistance links between intermediate doped buried layers 930 and 931, respectively, and source/drain implants for the transistors or other active devices formed in substrate 902. In addition, next source/drain regions may be formed and contacts, including well taps, may be formed. Well taps, including N-Well tap 952, N-Well tap 954, and buried-guard ring (BGR) P-Well taps 956 and 957 may be formed. Thus, in this example, in contrast with the example described in FIG. 8, devices formed in isolated P-Well 911 may be protected from latch up and hardened against radiation effects. In this example, a desired bias may be applied to BGR P-Well taps 956 and 957 to collect any charges that might be generated in substrate 902. The combination of intermediate doped buried layers 930 and 931, and vertical doping conductors 940 and 941 may create low resistance paths that improve the collection of charge in substrate 902 that would otherwise disturb the devices and circuits formed in substrate 902. Thus, in this example, even though charge may be created by energetic particle strikes, an electrical disturbance, or leakage current, the low resistance path helps remove the charge. In this manner, intermediate doped buried layers 930 and 931 and vertical doping conductors 940 and 941 improve radiation hardness of integrated circuit 900 and eliminate latch-up even when integrated circuit 900 is operating at higher temperatures than most devices. In addition to providing a low resistance path from the substrate to a biasing terminal (e.g., BGR P-Well tap 956), intermediate doped buried layer 930 increases the effective thickness of buried doped layer 904 in regions of integrated circuit 900 where charge collection and removal is desired. In addition to providing a low resistance path from the substrate to a biasing terminal (e.g., BGR tap 957), intermediate doped buried layer 931 provides charge collection functionality analogous to buried doped layer 904 in isolated P-Well regions (e.g. isolated P-Well 911) of integrated circuit 900. The increased effective thickness presents a larger cross-section to the injected charge and increases its collection and efficient charge collection is now provided in isolated P-Well regions, improving radiation hardness and latch-up mitigation throughout integrated circuit 900.

With continued reference to FIG. 9, additional implants 982, 984, and 986 may be performed to increase the total integrated dose (TID) for the integrated circuit. As the integrated circuit is bombarded by energetic particles, these particles create electron-hole pairs in the dielectric regions of the integrated circuit. A certain fraction of the electron-hole pairs can get trapped in the dielectric. The movement of the holes through the dielectric can also release hydrogen ions, which can themselves create interface states that further enhance charge trapping in the dielectric regions of the integrated circuit. Eventually, when enough positive charge has been trapped in the dielectric the voltage at the silicon surface inverts. The inversion layers provide leakage paths for current between n-type source and drain regions and between N-Well regions and adjacent n-type source/drain regions. As the integrated dose increases, so do the amount of the trapped charge, the degree of inversion, and the leakage current until the leakage current exceeds that specified for the integrated circuit (IC). Implants 982, 984 and 986 are placed under the Field Isolation in specific areas in addition to the standard Field Threshold Implants in the CMOS process in order to decrease the degree of inversion and the leakage current in those areas for any integrated dose and allow the IC to remain functional to higher total integrated dose. These implants can be placed only around the perimeters of N-Well regions between the N-Wells and external N+ Source/Drain regions, between the interior perimeters of N-Wells and the interior N+ Source/Drain regions, in the P-Well regions where the Active spacing is large enough to accommodate the additional doping or in a combination of these areas. Implants 982, 984 and 986 may be implanted with a dedicated mask. Implants 982, 984 and 986 increase the total integrated dose (TID) for the integrated circuit and work in conjunction with the other radiation hardening and latch-up elimination structures to improve the reliability of the integrated circuit when exposed to radiation.

Figure 10:
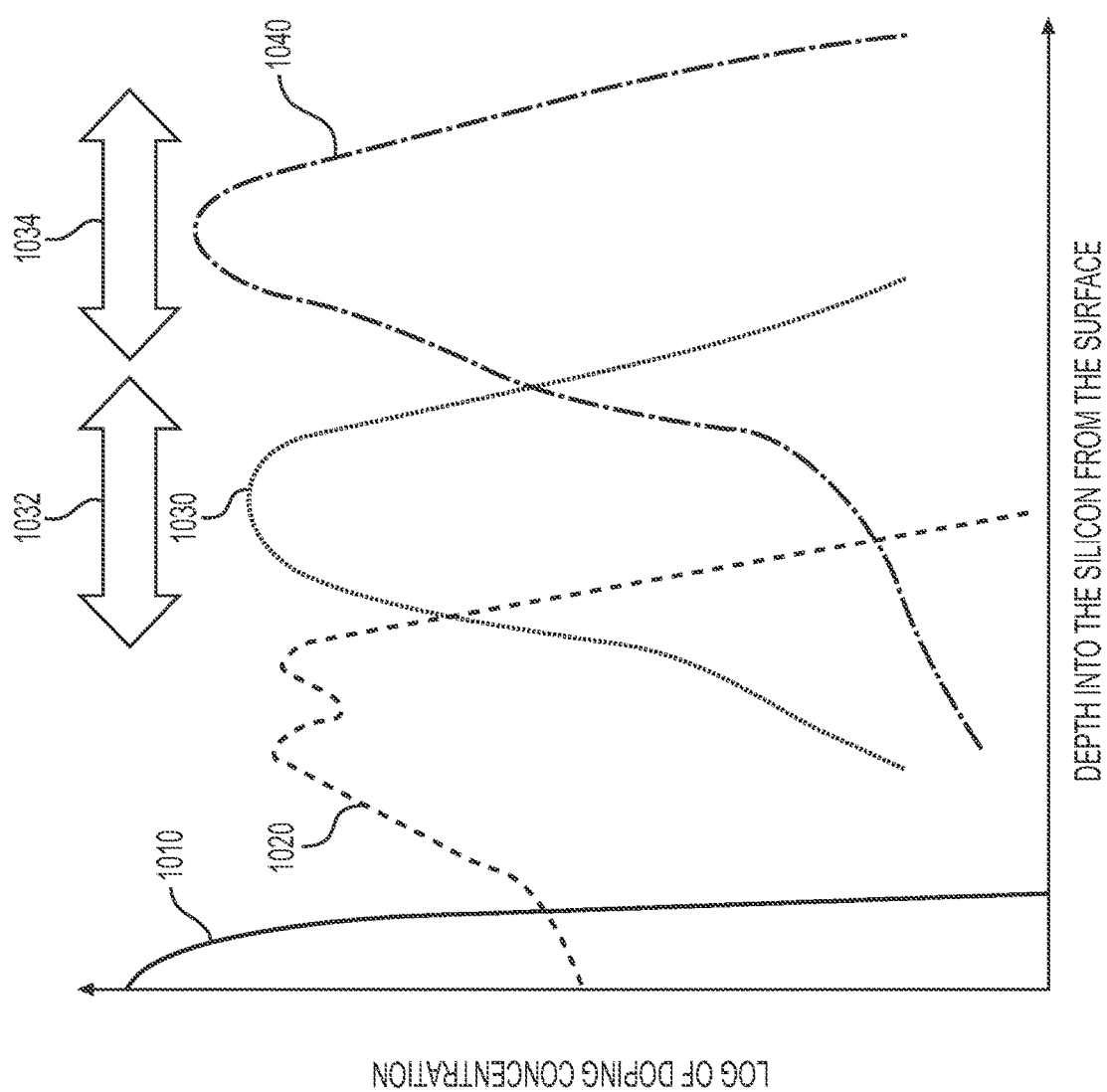
FIG. 10 is a diagram showing doping concentrations of implants into the substrate of an integrated circuit in accordance with one example.

FIG. 10 is a diagram showing doping concentrations of implants into the substrate of an integrated circuit in accordance with one example. In this example, the log of doping concentration of the implants is shown along the vertical axis and the depth into the silicon from the surface is shown along the horizontal axis. Implant profile 1010 shows the variation in the doping concentration of surface threshold voltage implants with regard to the depth into the silicon. Implant profile 1020 shows the variation in the doping concentration of retrograde well implants with regard to the depth into the silicon. Implant profile 1030 shows the variation in the doping concentration of the intermediate buried layer implant (e.g., implant corresponding to intermediate doped buried layer 930 of FIG. 9) with regard to the depth into the silicon. Implant profile 1040 shows the variation in the doping concentration of the buried doped layer implant (e.g., implant corresponding to doped buried layer 904 of FIG. 9) with regard to depth into the silicon. As shown in FIG. 10 in region 1032, implant profile 1030 has a distinct peak relative to implant profile 1020. Similarly, in region 1034, implant profile 1040 has a distinct peak relative to both the peak for any retrograde well implant (e.g., implant profile 1020) and implant profile 1030. In addition, while the retrograde well implants (shown via implant profile 1020) may contribute significantly to the doping at or near the surface of the integrated circuit, each of the implants related to the doped buried layers (represented by implant profiles 1030 and 1040) do not contribute to the doping at or near the surface of the integrated circuit. In addition, implant profiles 1030 and 1040 are not intended to be influence the operation and characteristics of the transistor as determined by profiles 1010 and 1020.

In conclusion, the present disclosure relates to a process for making an integrated circuit in a substrate. The process may include forming a first doped buried layer. The process may further include forming a first well of a first conductivity type and a second well of the first conductivity type. The process may further include using a first mask, forming a second doped buried layer only in a first region above the first doped buried layer and between at least the first well and the second well, wherein the first mask is configured to control at least a first spacing between the second doped buried layer and the first well and a second spacing between the second doped buried layer and the second well. The process may further include using a second mask, different from the first mask, forming a vertical conductor located only in a second region above the first region and between at least the first well and the second well, wherein the vertical conductor is doped to provide a low resistance link between the second doped buried layer and at least a top surface of the substrate.

The first region may be a portion of a p-well formed in the substrate. The process may further include forming a p-well tap configured to supply a bias voltage to the first doped buried layer and the second doped buried layer via the low resistance link. The bias voltage may be configured to collect, via the low resistance link, at least a portion of charge accumulated in the substrate as a result of any impact of charged particles on the integrated circuit.

The first conductivity type may be n-type. The process may further include forming the first doped buried layer comprises implanting boron ions at a relatively high implantation energy and wherein forming the second doped buried layer comprises implanting boron ions at a relatively low implantation energy. The process may further include forming a first implant adjacent to the first well and forming a second implant adjacent to the second well.

In another aspect, the present disclosure further relates to an integrated circuit including a substrate, a first well of a first conductivity type, and a second well of the first conductivity type. The integrated circuit may further include a first doped buried layer, formed in the substrate, below each of the first well and the second well. The integrated circuit may further include a second doped buried layer formed only in a first region above the first doped buried layer and between at least the first well and the second well. The integrated circuit may further include a vertical conductor located only in a second region above the first region and between at least the first well and the second well, where the vertical conductor is doped to provide a low resistance link between the second doped buried layer and at least a top surface of the substrate.

The first region may be a portion of a p-well formed in the substrate. The integrated circuit may further include a well-tap formed to supply a bias voltage to the first buried layer and the second buried layer via the low resistance link, wherein the bias voltage is configured to collect, via the low resistance link, at least a portion of charge accumulated in the substrate as a result of any impact of charged particles on the integrated circuit.

The integrated circuit may further include a first implant formed adjacent to the first well and a second implant formed adjacent to the second well. Each of the first doped buried layer and the second doped buried layer is formed by implanting boron ions in the substrate.

In yet another aspect, the present disclosure relates to an integrated circuit including a substrate, a first well of a first conductivity type in the substrate, a second well of the first conductivity type formed in the substrate, a third well of the first conductivity type formed in the substrate below the second well, and a fourth well of a second conductivity type, different from the first conductivity type, formed in the substrate. The integrated circuit may further include a first doped buried layer, formed in the substrate, below at least the fourth well. The integrated circuit may further include a second doped buried layer formed in a first region above the first doped buried layer and between at least the first well and the second well. The integrated circuit may further include a first vertical conductor formed in a third region above the first region and between at least the first well and the second well, where the first vertical conductor is doped to provide a first low resistance link between the second doped buried layer and at least a top surface of the substrate. The integrated circuit may further include a second vertical conductor formed in a fourth region above the second region, where the second vertical conductor is doped to provide a second low resistance link between the third doped buried layer and at least the top surface of the substrate.

The integrated circuit may further include a first well-tap formed to supply a first bias voltage to the substrate via the first low resistance link. The first bias voltage may be configured to collect, via the first low resistance link, at least a first portion of charge accumulated in the substrate as a result of any impact of charged particles on the integrated circuit. The integrated circuit may further include a second well-tap formed to supply a second bias voltage to the substrate via the second low resistance link. The second bias voltage may be configured to collect, via the second low resistance link, at least a second portion of charge accumulated in the substrate as a result of any impact of charged particles on the integrated circuit.

The first region may be a portion of a p-well formed in the substrate. The integrated circuit may further include a first implant formed adjacent to the first well and a second implant formed adjacent to the second well. The integrated circuit may further include a third doped buried layer formed in a second region above the third well.

It is to be understood that the processes and components depicted herein are merely exemplary. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A process for making an integrated circuit in a substrate, the
process comprising:
forming a first doped buried layer;
forming a first well of a first conductivity type and a second well of the first conductivity type;
forming a second doped buried layer only in a first region above the first doped buried layer and between at least the first well and the second well; and
forming a vertical conductor located only in a second region above the first region and between at least the first well and the second well, wherein the vertical conductor is doped to provide a low resistance link such that a combination of the vertical conductor and the second doped buried layer is configured to collect a portion of charge created in the substrate.

2. The process of claim 1, wherein the first region is a portion of a p-well formed in the substrate.

3. The process of claim 2 further comprising forming a p-well tap configured to supply a bias voltage to the first doped buried layer and the second doped buried layer via the low resistance link.

4. The process of claim 3, wherein the bias voltage is configured to aid collection, via the low resistance link, of at least a portion of charge created in the substrate as a result of any impact of energetic radiation on the integrated circuit or as a result of any electrical disturbance in the integrated circuit.

5. The process of claim 1, wherein the first conductivity type is n-type.

6. The process of claim 1, wherein forming the first doped buried layer comprises implanting boron ions at a relatively high implantation energy and wherein forming the second doped buried layer comprises implanting boron ions at a relatively low implantation energy.

7. The process of claim 1 further comprising forming at least one of a first implanted region adjacent to the first well or a second implanted region adjacent to the second well.

8. An integrated circuit comprising:
a substrate;
a first well of a first conductivity type;
a second well of the first conductivity type;
a first doped buried layer formed in the substrate;
a second doped buried layer formed only in a first region above the first doped buried layer and between at least the first well and the second well;
an implanted region formed adjacent to either the first well or the second well, wherein the implanted region is formed to increase the total integrated dose (TID) capability of the integrated circuit; and
a vertical conductor located only in a second region above the first region and between at least the first well and the second well; wherein the vertical conductor is doped to provide a low resistance link such that a combination of the vertical conductor and the second doped buried layer is configured to collect a portion of charge created in the substrate.

9. The integrated circuit of claim 8, wherein the first region is a portion of a p-well formed in the substrate.

10. The integrated circuit of claim 8 further comprising a well-tap formed to supply a bias voltage to the first buried layer and the second buried layer via the low resistance link, wherein the bias voltage is configured to collect, via the low resistance link, at least a portion of charge created in the substrate as a result of any impact of energetic radiation on the integrated circuit or as a result of any electrical disturbance in the integrated circuit.

11. The integrated circuit of claim 8, wherein the implanted region further comprises at least one of a first implanted region formed adjacent to the first well or a second implanted region formed adjacent to the second well.

12. The integrated circuit of claim 8, wherein each of the first doped buried layer and the second doped buried layer is formed by implanting boron ions in the substrate.

13. A process for making an integrated circuit in a substrate comprising:
forming a first well of a first conductivity type in the substrate;
forming a second well of the first conductivity type in the substrate;
forming a third well of the first conductivity type in the substrate below the second well;
forming a fourth well of a second conductivity type, different from the first conductivity type in the substrate;
forming a first doped buried layer below at least the fourth well;
forming a second doped buried layer in a first region above the first doped buried layer and between at least the first well and the second well;
forming a third doped buried layer in a second region above the third well;
forming a first vertical conductor in a third region above the first region and between at least the first well and the second well, wherein the first vertical conductor is doped to provide a first low resistance link between the second doped buried layer and at least a top surface of the substrate; and
forming a second vertical conductor in a fourth region above the second region, wherein the second vertical conductor is doped to provide a second low resistance link between the third doped buried layer and at least the top surface of the substrate.

14. The process of claim 13 further comprising forming a first well-tap configured to supply a first bias voltage to the substrate via the first low resistance link.

15. The process of claim 14 further comprising forming a second well-tap configured to supply a second bias voltage to the second region or the third doped buried layer via the second low resistance link.

16. The process of claim 13, wherein the first region is a portion of a p-type region formed in the substrate.

17. The process of claim 15, wherein the first bias voltage is configured to collect, via the first low resistance link, at least a first portion of charge created in the substrate as a result of any impact of energetic radiation on the integrated circuit or as a result of any electrical disturbance in the integrated circuit.

18. The process of claim 17, wherein the second bias voltage is configured to collect, via the second low resistance link, at least a second portion of charge created in the substrate as a result of any impact of energetic radiation on the integrated circuit or as a result of any electrical disturbance in the integrated circuit.

19. The process of claim 13 further comprising forming a first implanted region adjacent to the first well and a second implanted region adjacent to the second well.

20. The process of claim 13, wherein forming each of the first doped buried layer, the second doped buried layer, and the third doped buried layer comprises implanting boron ions in the substrate.

* * * * *